United States Patent
Akutagawa et al.

(10) Patent No.: US 6,807,654 B2
(45) Date of Patent: Oct. 19, 2004

(54) METHOD OF AND DEVICE FOR DETECTING PATTERN, METHOD OF AND DEVICE FOR CHECKING PATTERN, METHOD OF AND DEVICE FOR CORRECTING AND PROCESSING PATTERN, AND COMPUTER PRODUCT

(75) Inventors: Satoshi Akutagawa, Kawasaki (JP); Yoshimasa Iiduka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 113 days.

(21) Appl. No.: 10/067,827

(22) Filed: Feb. 8, 2002

(65) Prior Publication Data

US 2003/0018943 A1 Jan. 23, 2003

(30) Foreign Application Priority Data

Jul. 23, 2001 (JP) ........................................ 2001-221970

(51) Int. Cl.[7] .............................................. G06F 17/50
(52) U.S. Cl. ................................. 716/4; 716/19; 716/21
(58) Field of Search .................................. 716/4, 19, 21

(56) References Cited

U.S. PATENT DOCUMENTS

| | | | | |
|---|---|---|---|---|
| 5,502,001 A | * | 3/1996 | Okamoto | ................... 438/798 |
| 5,546,225 A | * | 8/1996 | Shiraishi | ..................... 359/559 |
| 6,014,456 A | * | 1/2000 | Tsudaka | ..................... 382/144 |
| 6,316,163 B1 | * | 11/2001 | Magoshi et al. | ............ 430/296 |
| 6,567,972 B1 | * | 5/2003 | Tanaka et al. | ................ 716/21 |

* cited by examiner

*Primary Examiner*—Vuthe Siek
*Assistant Examiner*—Brandon Bowers
(74) *Attorney, Agent, or Firm*—Westerman, Hattori, Daniels & Adrian, LLP (57) ABSTRACT

From the region near the target pattern, patterns whose barycenter positions are not changed even if deformation is generated due to proximity effect or coarse-and-fine difference at the time of pattern forming are selected as alignment patterns, and the barycenter positions thereof are set as alignment reference coordinates. Rough alignment is carried out based on the reference position provided in a region other than the device forming region, thereby detecting the alignment pattern in the device forming region. Positioning is carried out such that the alignment reference coordinates of the alignment patterns and the center coordinates of the target pattern coincide with each other, and the target pattern is detected.

20 Claims, 5 Drawing Sheets

METHOD OF AND DEVICE FOR DETECTING PATTERN, METHOD OF AND DEVICE FOR CHECKING PATTERN, METHOD OF AND DEVICE FOR CORRECTING AND PROCESSING PATTERN, AND COMPUTER PRODUCT

FIELD OF THE INVENTION

The present invention relates to a technology for detecting, checking, correcting, and processing a specific pattern of a mask used when semiconductor products, display devices for plasma display panels or liquid crystal display panels or a magnetic devices are produced.

BACKGROUND OF THE INVENTION

In recent years, as a semiconductor product and the like are reduced in size and increased in packing density, a mask pattern is remarkably increased in packing density and reduced in size, and high precision for a pattern forming procedure and high quality of the pattern are required. Although the amount of mask pattern is increased, it is required to swiftly carry out the inspection for checking precision of the mask pattern and feedback of failure mask pattern so as to shorten the developing time period of the semiconductor product or various devices. It is also necessary to effectively and precisely correct a mask pattern or process an LSI pattern formed on a wafer. Therefore, it is necessary to precisely check a target pattern in the mask pattern to be checked, corrected or processed.

As a conventional checking method of a mask pattern, there is a method in which a pattern having the same size as that of a pattern whose device characteristics must be ensure is disposed on a position where the pattern can easily be detected based on an alignment reference position out of device forming region, thereby detecting the pattern. If patterns become smaller as in recent years, deformation is generated in the pattern due to proximity effect or difference between coarse portion and fine portion (coarse-and-fine difference, hereinafter). According to this conventional method, however, it is not possible to check the pattern while taking influence on a device function or characteristics caused by the deformation of pattern into account.

Thereupon, in recent years, there is employed a method in which a pattern having great influence on its function or characteristics among patterns in the device forming region is designated as a pattern to be checked (target pattern, hereinafter), and the target pattern is checked. According to this checking method, in order to detect the target pattern, the pattern is automatically detected by visually confirming the pattern by a checking operator or moving a stage or a detecting optical system from an alignment (positioning) reference position out of the device forming region to coordinates of the target pattern. If the moving precision of the stage or the detecting optical system is not sufficient in this automatic detecting operation, it is necessary to visually confirm its state after the automatic detecting operation. There is also a method for detecting the target pattern by carrying out a data comparison collation check (Die TO Data check) while scanning the entire surface of the device forming region.

According to the method for checking the target pattern in the device forming region, however, since a pattern whose function or characteristics are largely influenced is set as the target pattern, the target pattern is not always disposed on an convenient position when the target pattern is checked. In other words, there is inconvenience that the target pattern is disposed on a position where it is difficult to detect the pattern in some cases. Further, when the target pattern is visually confirmed, if devices further become finer and denser and it is necessary to set a large number of, e.g., several hundred target patterns, there is a problem that the operational efficiency is inferior.

When the target pattern is automatically detected, with enlargement of the effective resolution region of recent pattern light-exposure device and with higher function of device, the device forming region is further increased. Therefore, there is a problem that the moving amount of the stage or detection optical system is increased and the moving error is also increased. In an existing checking device, for example, when the moving amount of the stage is about 40 mm, precision of a device using a stepping motor is about ±5 μm, and precision of a device using an encoder is about ±1 μm, and precision of a device using laser interferometer is about ±0.5 μm. The precision of any of these devices is insufficient for producing a device of 0.25 μm rule which becomes popular in recent years.

A stage system having extremely high precision used for an EB light-exposure device or the like may be used, but a new problem that equipment cost of the checking device is largely increased, and the device is increased in size is created. When the data comparison collation check is carried out while scanning the entire surface of the device forming region, since the pattern is checked including its shape, there are a problem that precision is inferior to measuring precision of a size check and a problem that several tens of minutes to several hours are taken for one plate such as a mask or a reticle and the checking time is increased.

A pattern suitable for alignment of the checking device can previously be provided in the vicinity of a target pattern, but this necessitates inserting a pattern which has nothing to do with function or characteristics of the device into the device forming region and thus, this is not preferable for satisfying the enhancement of chip yield by enhancing the function of the device or reducing the chip area.

SUMMARY OF THE INVENTION

It is an object of the invention to provide a method of and device for detecting pattern, in which alignment reference coordinates are set in a region near a target pattern in a device forming region, and the target pattern can swiftly and automatically be detected with high precision based on the alignment reference coordinates. It is another object of the invention to provide a method of and device for checking the target pattern detected by the pattern detecting method, and a method of and device for correcting or processing the pattern.

It is another object of this invention to provide a computer program that contains instructions which when executed on a computer realizes the method according to the present invention on the computer.

The pattern detecting method according to one aspect of the present invention comprises selecting, from a region near a target pattern to be processed in a device forming region having a group of patterns corresponding to a device to be produced, as an alignment pattern in a device forming region, patterns whose barycenter positions (i.e. center of gravity) in a first direction are not changed even if adjacent patterns approach and are deformed or patterns are deformed by coarse portion and fine portion thereof at the time of pattern forming, and setting a barycenter position of the alignment pattern in the first direction as alignment reference coordinates, and detecting the target pattern based on the alignment reference coordinates.

The pattern detecting method according to another aspect of the present invention comprises selecting, from a group of device patterns included in a region near a target pattern to be produced, as an alignment pattern in a device forming region, patterns whose barycenter positions in first direction (for example, X direction or Y direction) and second direction (for example, Y direction or X direction) are not changed even if adjacent patterns approach and are deformed or patterns are deformed by coarse portion and fine portion thereof at the time of pattern forming, and setting a barycenter position of the alignment pattern in the first and second directions as alignment reference coordinates, and detecting the target pattern based on the alignment reference coordinates.

The method of and device for checking the target pattern according to still another aspect of the present invention comprises checking the target pattern detected by the pattern detecting method.

The method of and device for correcting or processing the pattern according to still another aspect of the present invention comprises correcting or processing the target pattern detected by the pattern detecting method.

The computer programs according to still another aspect of the present invention stores instructions which when executed realizes the method according to the present invention on a computer.

Other objects and features of this invention will become apparent from the following description with reference to the accompanying drawings.

DETAILED DESCRIPTIONS

Figure 1:
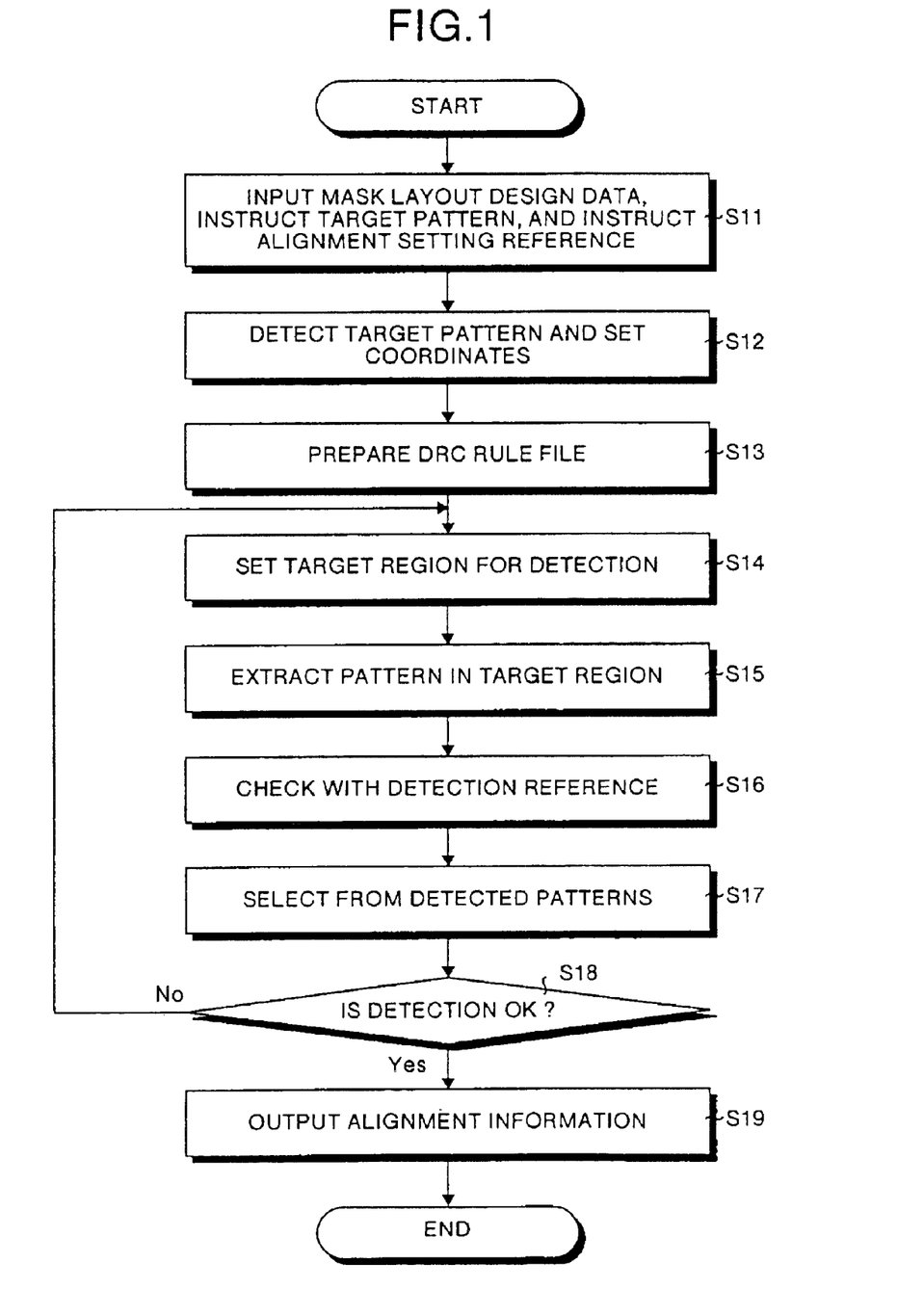
FIG. 1 is a flowchart showing one example of setting procedure of alignment reference coordinates in a pattern detecting method of the present invention.

Embodiments of the present invention will be explained in detail with reference to the accompanying drawings. FIG. 1 is a flowchart showing one example of setting procedure of alignment reference coordinates in a pattern detecting method of the invention. If a setting procedure of alignment reference coordinates is started, design data of a mask layout is input from a file or the like in which the design data is stored. When instruction information for specifying coordinates or the like of a target pattern is input as an instruction value or the target pattern is previously inserted into the design data, pattern information for setting its position coordinates is detected.

The pattern information is a constituent parameter in the design data for detecting layout information or pattern width of the designated pattern of the design data, and for example, if the pattern information is GDSII which is common as mask layout design data format of a semiconductor design, the pattern information is a LAYER, DATATYPE attribute including a TOP structure name of the mask pattern, a structure name including the designated pattern and the designated pattern.

When the pattern is formed, pattern forming reference information such as a pattern distance whose influence of a pattern deformation is negligible and a minimum resolution pattern value is instructed. The pattern distance whose influence of a pattern deformation is negligible is a minimum value of a pattern distance which does not need to take a pattern distance such as deformation caused by coarse-and-fine difference or approach of a pattern into account when a pattern is formed on a reticle or a mask plate.

The minimum resolution pattern value is a pattern minimum value in which a pattern in a step, procedure or technique applied to formation of a pattern in production of a reticle or a mask to be checked is formed as a pattern which can be optically detected, and is not a size after the pattern was formed, but is a size as light-exposure pattern. Condition information is instructed for satisfying constraints of an alignment mechanism which is inherent in a device such as a detecting device or correcting/working device such as a width of a region for detecting a pattern which becomes a candidate of an alignment pattern (alignment candidate pattern, hereinafter), the number of alignment patterns to be set, and its relative positional reference (step S11).

A target pattern is detected based on a design data of a mask layout input in step S11, and the instruction information for specifying the target pattern instructed in step S11 or target pattern detection information, and its coordinates are set (step S12). Based on a pattern forming reference information instructed in step S11, a design rule check file ("DRC rule file") for detecting the alignment pattern is formed (step S13).

Based on the width of the detection region of the alignment candidate pattern set in step S11, its coordinates of the detection region width is set around the coordinates of the target pattern obtained in step S12 (step S14). With the procedure explained heretofore, the region near the target pattern is set with respect to the device pattern data such as the design pattern data, light-exposure pattern data or checking pattern data.

The pattern information of the mask pattern in the detection region set in step S14 is extracted (step S15). A distance between adjacent patterns is calculated for each of the extracted patterns, and a pattern satisfying the reference is detected as the alignment candidate pattern by the DRC rule file formed in step S13 (step S16). The alignment candidate patterns detected here are patterns which are separated from each other at a distance or more (set in step S11) in which influence of pattern deformation at the time of pattern forming can be ignored.

Figure 2:
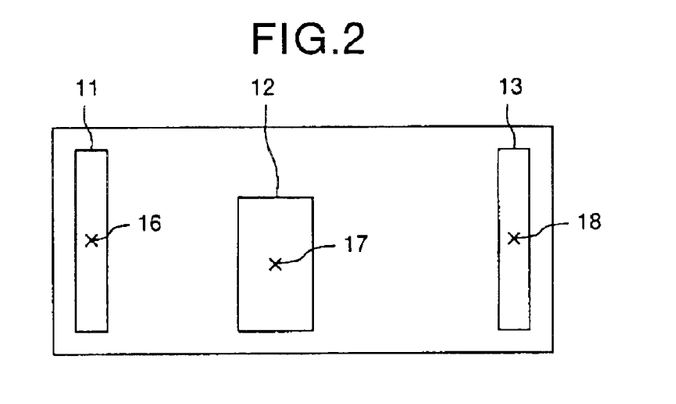
FIG. 2 is a schematic view which shows a pattern data image for explaining a case in which a barycenter position is not changed in a setting of the alignment reference coordinates in the pattern detecting method.
Figure 3:
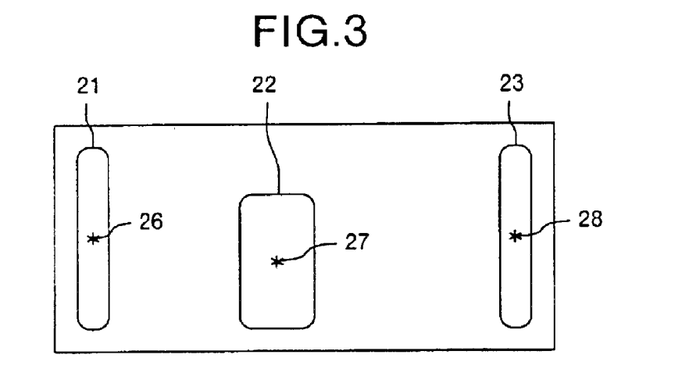
FIG. 3 is a schematic view which shows an actual mask pattern image for explaining a case in which the barycenter position is not changed in the setting of the alignment reference coordinates in the pattern detecting method.

As one example of such patterns, FIG. 2 shows a pattern data image and FIG. 3 shows an actual mask pattern image. In pattern data 11, 12 and 13 shown in FIG. 2, the center pattern data 12 is separated from the left pattern data 11 at a distance or more in which influence of pattern distance at the time of pattern forming can be ignored. The center pattern data 12 is also separated from the right pattern data 13 at a distance or more in which influence of pattern distance at the time of pattern forming can be ignored. Therefore, barycenter positions 16, 17 and 18 (shown with x) of the three pattern data 11, 12 and 13 respectively coincide with corresponding barycenter positions 26, 27 and 28 (shown with *) of actual mask patterns 21, 22 and 23 shown in FIG. 3. That is, in such a pattern, the barycenter positions are not changed.

In step S16, the distance between the adjacent patterns is a distance smaller than a distance (set in step S11) is about a value that can be resolved at the time of pattern forming and is smaller than such a distance that the influence of the pattern deformation can be ignored at the time of pattern forming, but patterns having the same distance between patterns adjacent to each other in a lateral direction (X direction) or the same distance between patterns adjacent to each other in a vertical direction (Y direction) are also detected as alignment candidate patterns. Patterns having the same distance between patterns adjacent to each other in a lateral direction (X direction) and the same distance between patterns adjacent to each other in a vertical direction (Y direction) are also included in the alignment candidate patterns.

Figure 4:
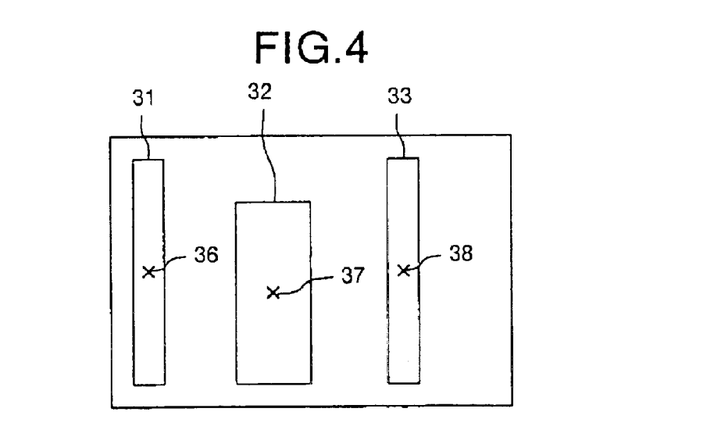
FIG. 4 is a schematic view which shows the pattern data image for explaining a case in which the barycenter position is not changed in the setting of the alignment reference coordinates in the pattern detecting method.
Figure 5:
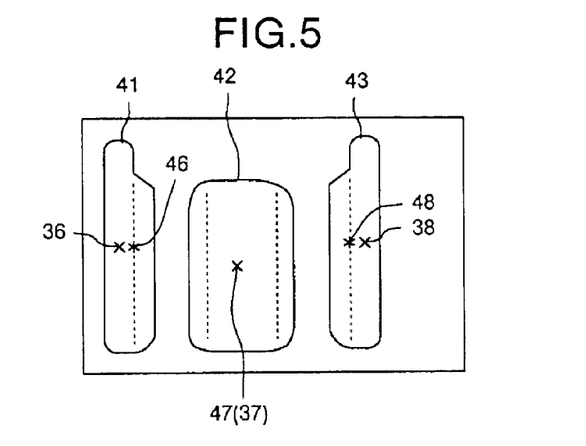
FIG. 5 is a schematic view which shows the actual mask pattern image for explaining a case in which the barycenter position is not changed in the setting of the alignment reference coordinates in the pattern detecting method.

As one example of such patterns, FIG. 4 shows a pattern data image and FIG. 5 shows an actual mask pattern image. In pattern data 31, 32 and 33 shown in FIG. 4, a distance between the center pattern data 32 and the left pattern data 31, and a distance between the pattern data 32 and the right pattern data 33 are smaller than such a distance that the influence of the pattern deformation can be ignored at the time of pattern forming, but are the same. Therefore, a barycenter position 47 (shown with *) of an actual mask pattern 42 corresponding to the center pattern data 32 coincides with a barycenter position 37 (shown with x) of the pattern data 32.

Barycenter positions 46 and 48 (shown with *) of the actual mask patterns 41 and 43 corresponding to the left and right pattern data 31 and 33 are deviated from barycenter positions 36 and 38 (shown with x) of the pattern data 31 and 33, respectively. Therefore, the center pattern is detected as the alignment candidate pattern.

Figure 6:
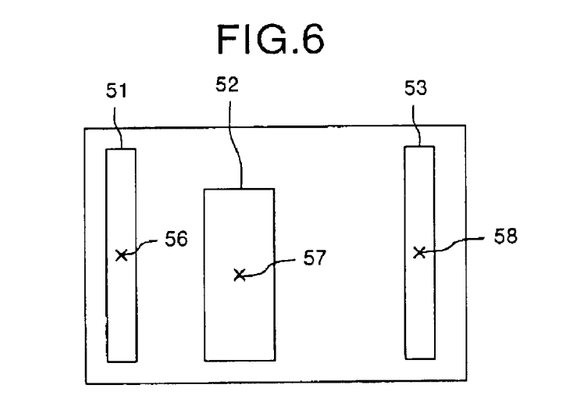
FIG. 6 is a schematic view which shows the pattern data image for explaining a case in which the barycenter position is changed in the setting of the alignment reference coordinates in the pattern detecting method.
Figure 7:
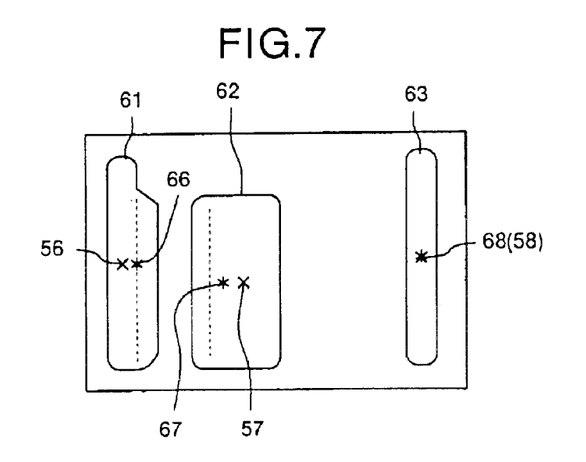
FIG. 7 is a schematic view which shows the actual pattern data image for explaining a case in which the barycenter position is changed in the setting of the alignment reference coordinates in the pattern detecting method.

Whereas, like a pattern data image and an actual mask pattern image shown in FIG. 6 and FIG. 7, if a distance between a center pattern data 52 and a left pattern data 51 is different from a distance between the pattern data 52 and the right pattern data 53, a barycenter position 67 (shown with *) of the actual mask pattern 62 corresponding to the center pattern data 52 is deviated from a barycenter position 57 (shown with x) of the pattern data 52. Therefore, in this case, the center pattern is not included in the alignment candidate pattern. In FIG. 6 and FIG. 7, reference numbers 56, 68, 66 and 68 represent barycenter positions, and reference numbers 61 and 63 represent actual mask patterns.

Referring back to FIG. 1, from a plurality of alignment candidate patterns detected in step S16, necessary number of patterns which are required for alignment of the checking device or the correcting/processing device and which can easily be detected based on the alignment reference position out of the device forming region in that device are selected as alignment patterns (step S17). At that time, the patterns are selected in the order closer to target pattern for example. After the selection, it is judged whether a desired number of alignment patterns are selected (step S18).

If the selected alignment patterns are insufficient, i.e., when detection is not OK (No in step S18), the procedure is returned to step S14, the detection region of the alignment candidate pattern is increased or the like, the operations in steps S15 to 18 are repeated and the alignment pattern is selected. If the desired number of alignment patterns are selected (Yes in step S18), center coordinates of the selected alignment patterns are defined as reference coordinates, and alignment information is output (step S19), and the procedure is completed. By selecting the plurality of alignment patterns in this manner, even if a position of the alignment pattern is deviated from its original position, alignment can be carried out with high precision by utilizing another alignment pattern.

Figure 8:
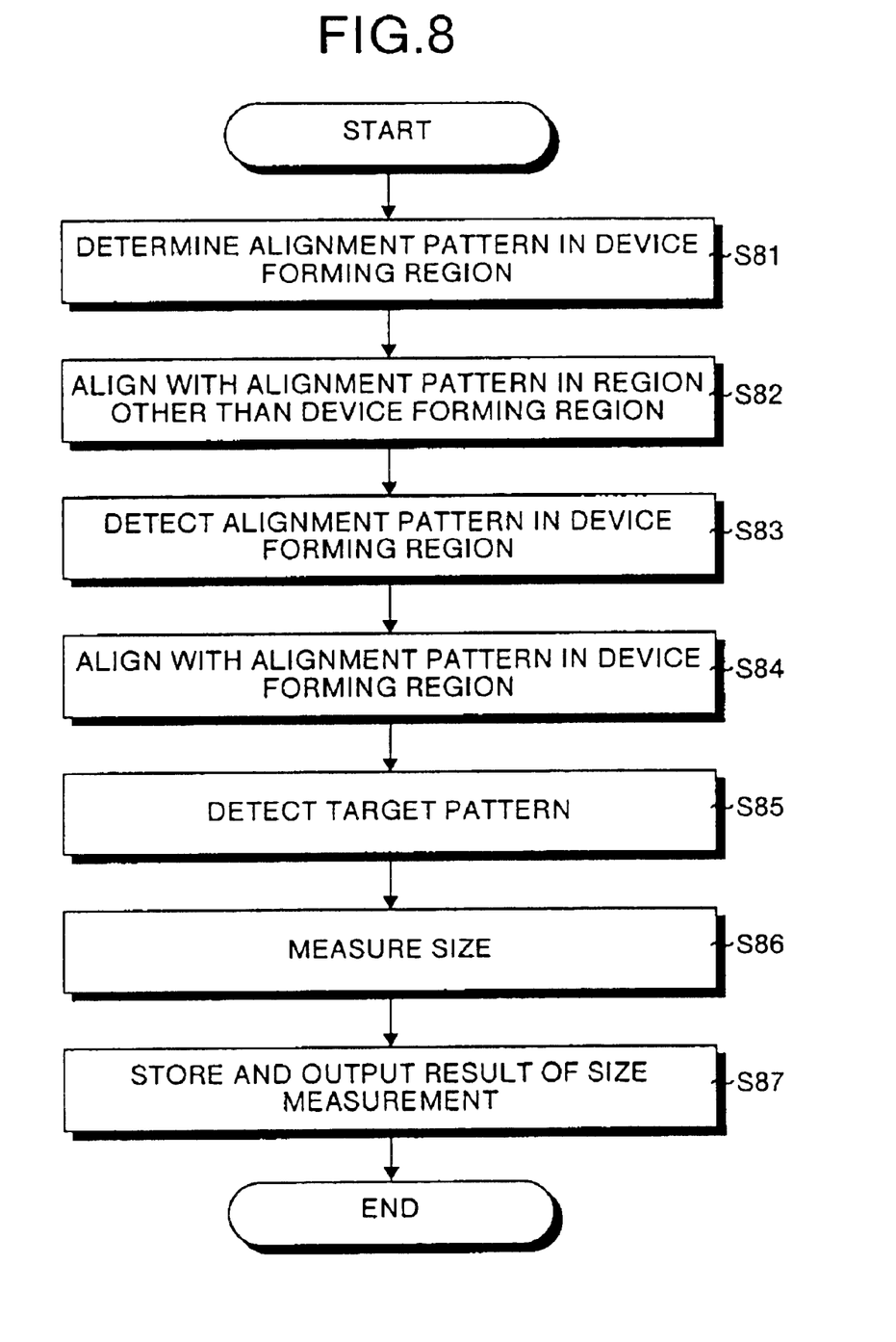
FIG. 8 is a flowchart showing one example of procedure for carrying out a size measuring check to which the pattern detecting method of the invention is applied.

Procedure when size measurement check is carried out using the alignment reference coordinates set in accordance with the above-described procedure will be explained as one example. FIG. 8 is a flowchart showing one example of procedure for carrying out a size measuring check to which the pattern detecting method of the invention is applied. If the size measurement check is started, an alignment pattern in the device forming region is determined (step S81). This operation is carried out in accordance with the setting procedure of the above-described alignment reference coordinates (see FIG. 1).

Alignment is roughly carried out (rough alignment) set in a region other than the device forming region is carried out based on a reference position (conventional alignment pattern) (step S82). A stage or a detection optical system is moved from this reference position, and an alignment pattern in the device forming region determined in step S81 is detected (step S83). The alignment is carried out based on the center coordinates of the alignment pattern in the detected device forming region, i.e., the alignment reference coordinates (step S84).

The stage or the detection optical system is moved from the alignment reference coordinates to the center coordinates of the target pattern, the target pattern is detected (step S85), the size is measured (step S86), its result is stored or output (step S87), and the checking is completed. When there exist a plurality of target patterns whose sizes are to be measured, the operations of steps S84 to 87 are repeated for target patterns disposed closely, and operations of steps S82 to 87 are repeated for target pattern disposed away from each other.

According to the above embodiment, even if a special pattern for the alignment or the like is not inserted in the device forming region, it is possible to provide an alignment pattern and alignment reference coordinates in the vicinity of the target pattern. Therefore, if the alignment reference coordinates are determined as references, it is possible to swiftly and automatically detect the target pattern as compared with a case in which an alignment reference position out of the conventional device forming region as the reference. It is also possible to swiftly and precisely detect the target pattern as compared with the conventional technique, and to check, correct or process the target pattern.

The present invention is not limited to the above-described embodiment, and various changes can be made. In the embodiment, the size checking procedure was explained with reference to FIG. 8, but it is possible to obtain the alignment pattern and the alignment reference coordinates in accordance with the procedure shown in FIG. 1, and using the same, it is possible to check the position of disposition of the pattern and to correct and process the pattern in accordance with the procedure shown in FIG. 8. When CAD data is pattern-corrected to form a mask pattern on a plate such as a wafer or reticle by correcting a mask pattern such as recent OPC or PSM, the present invention is effective for checking pattern such as confirmation of size, shape and an amount of pattern correction.

Figure 9:
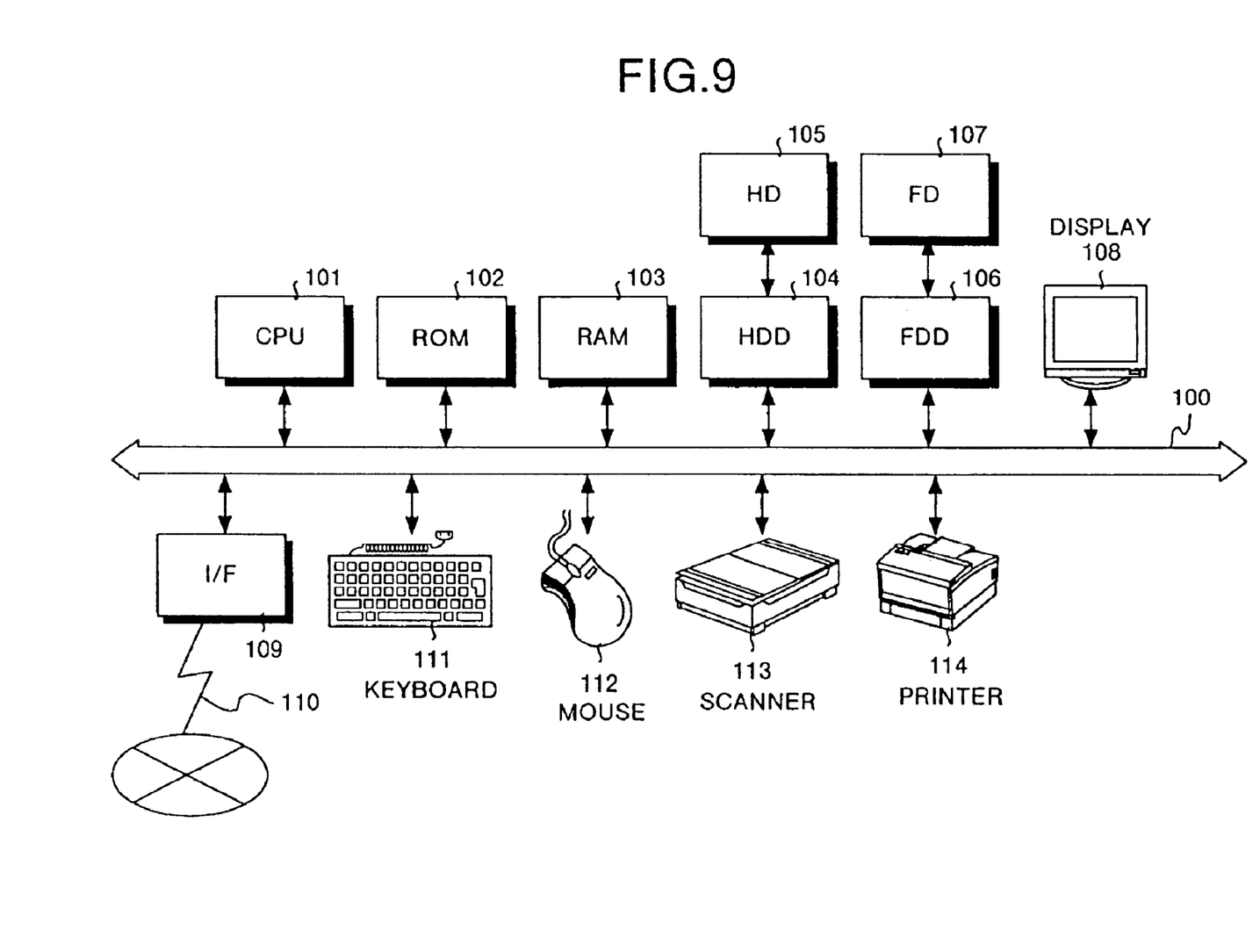
FIG. 9 is a block diagram showing a structure of hardware of a computer used for carrying out the pattern detecting method, a pattern checking method, and a pattern correcting or processing method of the invention.

FIG. 9 is a block diagram showing a structure of hardware of a computer used for carrying out the pattern detecting method, the pattern checking method, and the pattern correcting or processing method of the invention. In FIG. 9, an information processing device comprises a CPU 100, a ROM 102, RAM 103, a HDD (hard disk drive) 104, a HD (hard disk) 105, a FDD (floppy disk drive) 106, a FD (floppy disk) 107 as one example of detachable storage medium, display 108, an I/F (interface) 109, a keyboard 111, a mouse 112, a scanner 113 and a printer 114. These constituent elements are connected to each other through bus 100.

The CPU 101 controls the entire information processing device. The ROM 102 stores a program such as a boot program. The RAM 103 is used as a work area of the CPU 101. The HDD 104 controls read/write of data with respect to the HD 105. The HD 105 stores data written under control of the HDD 104.

The FDD 106 controls read/write with respect to the FD 107 in accordance with control of the CPU 101. The FD 107 stores data written under control of the FDD 106, and reads data stored in the FD 107 into the information processing device. As the detachable storage medium, a CD-ROM (CD-R, CD-RW), an MO, a DVD (Digital Versatile Disk), or a memory card may be used other than the FD 107. The display 108 displays a window (browser) concerning data such as a cursor, an icon, a toolbox, a text, an image and function information. The display 108 is a CRT, a TFT liquid crystal display or a plasma display.

The I/F (interface) 109 is connected to a network such as a LAN or the Internet through a communication line 110, and is connected to another information processing device (server or the like) through the network. The I/F 109 controls interface between the network and interior, and controls input and output of data from the other server or terminal device. For example, the I/F 109 is a modem or the like. When the information processing device carries out radio communication such as a portable telephone, the I/F 109 also includes a function as a communication device (radio transmitter-receiver).

The keyboard 111 includes keys for inputting text, number and various instructions or the like, and inputs data. The keyboard 111 may be a tough-panel input pad. The mouse 112 moves a cursor, selects a range, moves a window and changes a size. The mouse 112 may be a trackball or joystick only if it has the same function as a pointing device.

The optically reads an image, and captures image data into the information processing device. The printer 114 prints the image data or text data. For example, the printer 114 is a laser printer, an ink-jet printer or the like.

The pattern detecting method, the pattern checking method and the pattern correcting/processing method of the present embodiment may be a program that can be read by a previously prepared computer, and is realized by executing the program using a personal computer or a computer such as a work station. This program is stored in a computer-readable storage medium such as the HD (hard disk), the FD (floppy disk), the CD-ROM, the MO, the DVD or the like, and is read from the storage medium by the computer and is executed. This program may be a transmission medium capable of distributing the data through a network such as the Internet.

According to the present invention, since the alignment reference coordinates can be set in the vicinity of the target pattern, if the alignment reference coordinates are set as references, it is possible to swiftly and automatically detect the target pattern precisely as compared with a conventional case in which an alignment reference position in a region other than the device forming region is set as the reference. Further, it is possible to swiftly and precisely detect the target pattern as compared with the conventional technique, and to check, correct or process the target pattern.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of detecting a target pattern in a device forming region on a mask comprising:

selecting, from among a group of patterns included in a region near the target pattern, the region being in the device forming region, a pattern having a barycenter position at a barycenter of the pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed;

setting the barycenter position of the alignment pattern in the first direction as alignment reference coordinates; and detecting the target pattern based on the alignment reference coordinates.

2. The method according to claim 1, wherein a pattern that is equally distant from two of the patterns adjacent to the pattern in the first direction is selected as the alignment pattern.

3. The method according to claim 1, wherein from among adjacent patterns which are adjacent to each other in the first direction, a pattern separated from the adjacent patterns by a distance that does not cause deformation of the adjacent patterns is selected as the alignment pattern.

4. The method according to claim 1, further detecting the alignment pattern in the device forming region based on a reference position provided outside the device forming region after the alignment reference coordinates are set and before the target pattern is detected based on the alignment reference coordinates.

5. A method of detecting a target pattern in a device forming region on a mask, comprising:

selecting, from among a group of patterns included in a region near the target pattern, the region being in the device forming region, a pattern having a barycenter position at barycenters of the pattern in first and second directions, the barycenter position not being displaced from a predetermined barycenter even if the patterns are deformed when the patterns are formed on the mask, as an alignment pattern in the device forming region, the alignment pattern for setting a position at which the detection of the target pattern is performed:

setting the barycenter position of the alignment pattern as alignment reference coordinates, and detecting the target pattern based on the alignment reference coordinates.

6. The method according to claim 5, wherein a pattern that is equally distant from two of the patterns adjacent to the pattern in the first or second direction is selected as the alignment pattern.

7. The method according to claim 5, wherein from among adjacent patterns which are adjacent to each other in the first or second direction, a pattern separated from the adjacent patterns by a distance that does not cause deformation of the adjacent patterns is selected as the alignment pattern.

8. The method according to claim 5, further detecting the alignment pattern in the device forming region based on a reference position provided outside the device forming region after the alignment reference coordinates are set and before the target pattern is detected based on the alignment reference coordinates.

9. A method of checking a target pattern in a device forming region on a mask, the method comprising:

selecting, from among a group of patterns included in a region near the target pattern, the region being in the device forming region, a pattern having a barycenter position in a first direction, the barycenter position not being displaced from a predetermined barycenter even if the patterns are deformed when the patterns are formed on the mask, as an alignment pattern in the device forming region, the alignment pattern for setting a position at which the detection of the target patter is performed;

setting the barycenter position of the alignment pattern in the first direction as alignment reference coordinates;

detecting the target pattern based on the alignment reference coordinates; and checking the target pattern detected.

10. A method of correcting or processing a pattern in a device forming region on a mask, the method comprising:

selecting, from among a group of patterns included in a region near the target pattern, the region being in the device forming region, a pattern having a barycenter position at a barycenter pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed;

setting the barycenter position of the alignment pattern in the first direction as alignment reference coordinates;

detecting the target pattern based on the alignment reference coordinates; and correcting or processing the target pattern detected.

11. A device detecting a target pattern in a device forming region on a mask, the device comprising:

an alignment reference setting unit which selects, from among a group of patterns included in a region near the target pattern, the region being in the device forming region, a pattern having a barycenter position at a barycenter of the pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed, and sets the barycenter position of the alignment pattern in the first direction as alignment reference coordinates; and a target pattern detecting unit which detects the target pattern based on the alignment reference coordinates.

12. The device according to claim 11, wherein a pattern that is equally distant from two of the patterns adjacent to the pattern in the first direction is selected as the alignment pattern.

13. The device according to claim 11, wherein from among adjacent patterns which are adjacent to each other in the first direction, a pattern separated from the adjacent patterns by a distance that does not cause deformation of the adjacent patterns is selected as the alignment pattern.

14. A device detecting a target pattern in a device forming region on a mask, the device comprising:

an alignment reference setting unit which selects, from among a group patterns included in a region near the target pattern, the region being in the device forming region, a pattern having a barycenter position at barycenters of the pattern in first and second directions, the barycenter position not being displaced form a predetermined barycenter even if the patterns are deformed when the patterns are formed on the mask, as an alignment pattern in the device forming region, the alignment pattern for setting a position at which the detection of the target pattern is performed, and sets the barycenter position of the alignment pattern as alignment reference coordinates; and a target pattern detecting unit which detects the target pattern based on the alignment reference coordinates.

15. The device according to claim 14, wherein a pattern that is equally distant from two or the patterns adjacent to the pattern in the first or second direction is selected as the alignment pattern.

16. The device according to claim 14, wherein from among adjacent patterns which are adjacent to each other in the first or second direction, a pattern separated from the adjacent patterns by a distance that does not cause deformation of the adjacent patterns is selected as the alignment pattern.

17. A device checking a target pattern in a device forming region on a mask, the device comprising:

an alignment reference setting unit which selects, from among a group of patterns included in a region near the target pattern, the region being in the device forming region, a pattern having a barycenter position at a barycenter of the pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed, and sets the barycenter position of the alignment pattern in the first direction as alignment reference coordinates;

a target pattern detecting unit which detects the target pattern based on the alignment reference coordinates; and a checking unit which checks the target pattern detected.

18. A device correcting or processing a pattern in a device forming region on a mask, the device comprising:

an alignment reference setting unit which selects, from among a group of patterns included in a region near the target pattern, the region being in the device forming region, a pattern having a barycenter position at a barycenter of the pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed, and sets the barycenter position of the alignment pattern in the first direction as alignment reference coordinates;

a target pattern detecting unit which detects the target pattern based on the alignment reference coordinates; and a correcting/processing unit which corrects or processes the target pattern detected.

19. A computer program containing instructions which when executed on a computer causes the computer to perform the steps of:

selecting, from among a group of patterns included in a region near the target pattern, the region being in the device forming region, a pattern having a barycenter position at a barycenter of the pattern in a first direction, the barycenter position not being displaced from a predetermined barycenter even if the patterns are deformed when the patterns are formed on the mask, as an alignment pattern in the device forming region, the alignment pattern for setting a position at which the detection of the target pattern is performed, setting the barycenter position of the alignment pattern in the first direction as alignment reference coordinates; and detecting the target pattern based on the alignment reference coordinates.

20. A computer program containing instructions which when executed on a computer causes the computer to perform the steps of:

selecting, from among a group of patterns included in a region near the target pattern, the region being in the device forming region, a pattern having a barycenter position at barycenters of the pattern in first and second directions, the barycenter position not being displaced form a predetermined barycenter even if the patterns are deformed when the patterns are formed on the mask, as an alignment pattern in the device forming region, the alignment pattern for setting a position at which the detection of the target pattern is performed, and setting the barycenter position of the alignment pattern as alignment reference coordinates; and detecting the target pattern based on the alignment reference coordinates.

\* \* \* \* \*